United States Patent
Hattori et al.

(10) Patent No.: US 6,527,818 B2
(45) Date of Patent: Mar. 4, 2003

(54) AQUEOUS DISPERSION FOR CHEMICAL MECHANICAL POLISHING

(75) Inventors: Masayuki Hattori, Tokyo (JP); Kiyonobu Kubota, Tokyo (JP); Kazuo Nishimoto, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/778,817

(22) Filed: Feb. 8, 2001

(65) Prior Publication Data

US 2001/0039766 A1 Nov. 15, 2001

(30) Foreign Application Priority Data

| Feb. 9, 2000 | (JP) | .................................. 2000-031887 |
| Jun. 14, 2000 | (JP) | .................................. 2000-178760 |
| Jun. 19, 2000 | (JP) | .................................. 2000-183465 |

(51) Int. Cl.⁷ .......................... C09K 3/14; C09G 1/02; C09G 1/04; B24B 1/00
(52) U.S. Cl. .......................... 51/308; 51/307; 51/309; 106/3; 216/89; 216/100; 216/102; 216/103; 216/105; 216/106; 216/108
(58) Field of Search .................... 51/307, 308, 309; 106/3; 438/692, 693; 252/79.1, 79.2, 79.4; 216/89, 100, 102, 103, 105, 106, 108

(56) References Cited

U.S. PATENT DOCUMENTS 6,083,840 A * 7/2000 Mravic et al. ................ 216/89

FOREIGN PATENT DOCUMENTS

| EP | 0 999 254 | 5/2000 |
| JP | 61-055845 | 3/1986 |
| JP | 62-102543 | 5/1987 |
| JP | 5-275366 | 10/1993 |
| JP | 6-313164 | 11/1994 |
| JP | 6-103681 | 12/1994 |
| JP | 07-216345 | 8/1995 |
| JP | 7-233485 | 9/1995 |
| JP | 8-017831 | 1/1996 |
| JP | 8-197414 | 8/1996 |
| JP | 8-510437 | 11/1996 |
| JP | 10-044047 | 2/1998 |
| JP | 10-265766 | 10/1998 |
| JP | 11-135467 | 5/1999 |
| JP | 2000-119639 | 4/2000 |
| WO | WO 94/28194 | 12/1994 |
| WO | WO 96/07772 | 3/1996 |

* cited by examiner

Primary Examiner—Michael Marcheschi
(74) Attorney, Agent, or Firm—Oblon, Spivak, McClelland, Maier & Neustadt, P.C.

(57) ABSTRACT

There is provided an aqueous dispersion for CMP with an excellent balance between chemical etching and mechanical polishing performance. The aqueous dispersion for CMP of the invention is characterized by comprising an abrasive, water and a heteropolyacid. Another aqueous dispersion for CMP according to the invention is characterized by comprising an abrasive, water, a heteropolyacid and an organic acid. Yet another aqueous dispersion for CMP according to the invention is characterized by comprising colloidal silica with a primary particle size of 5–100 nm, water and a heteropolyacid. Preferred for the heteropolyacid is at least one type selected from among silicomolybdic acid, phosphorotungstic acid, silicotungstic acid, phosphoromolybdic acid and silicotungstomolybdic acid. Preferred for the organic acid is at least one selected from among oxalic acid, malonic acid, succinic acid, glutaric acid, adipic acid, maleic acid, fumaric acid, phthalic acid, malic acid, tartaric acid and citric acid.

16 Claims, No Drawings

AQUEOUS DISPERSION FOR CHEMICAL MECHANICAL POLISHING

BACKGROUND OF THE INVENTION

1. Field of the Invention

The present invention relates to an aqueous dispersion for chemical mechanical polishing. More specifically, the invention relates to an aqueous dispersion that is particularly useful for chemical mechanical polishing of metal layers during production steps for semiconductor devices.

2. Description of the Prior Art

Improvements in degrees of semiconductor device integration and increased multilayer wiring have led to the introduction of chemical mechanical polishing (hereunder referred to as "CMP") techniques for polishing of working films and the like. As disclosed in Japanese Laid-open Patent Publication No. Sho-62 -102543, No. Sho-64-55845 and No. Hei-5-275366, Published Japanese translations of PCT international publication for patent applications No. Hei-8-510437, and Japanese Laid-open Patent Publication No. Hei-8-17831, No. Hei-8-197414 and No. Hei-10-44047, there are employed methods whereby wiring is formed by embedding a wiring material such as tungsten, aluminum or copper in a hole or trench formed in the insulation film of a process wafer, and then removing the excess wiring material by CMP.

In this CMP process, the chemical etching and mechanical polishing must be effectively incorporated together and the balance between the chemical function and mechanical function is important for obtaining a polished surface with sufficiently high precision.

Many types of aqueous dispersions have been proposed as compositions for CMP, and in recent years particular emphasis has been on improving the chemical etching function. For example, in Japanese Patent Publication No. Hei-6-103681 there is disclosed a polishing composition comprising abrasive particles, a transitional chelate salt and a solvent that dissolves the salt. In Japanese Laid-open Patent Publication No. Hei-6-313164 there is disclosed a polishing composition composed of a polishing material comprising an aqueous colloidal silica sol or gel and a polishing accelerator comprising a persulfuric acid salt. In Japanese Laid-open Patent Publication No. Hei-7-233485 there is described a polishing composition containing aminoacetic acid, amidosulfuric acid, an oxidizing agent and water. In Japanese Laid-open Patent Publication No. Hei-11-135467 there is described a polishing composition containing a tetravalent cerium salt in aqueous solution. In Japanese Laid-open Patent Publication No. Hei-10-265766 there is described a polishing composition comprising a combination of hydrogen peroxide and a catalytic amount of iron ion. However, while these polishing compositions all have greater chemical etching ability and higher removal rates, the balance with the mechanical polishing ability is insufficient, such that the wiring materials undergo excessive etching, corrosion traces are left on the polishing surfaces, and dishing, thinning and keyholes are produced on plug surfaces, creating a problem in that satisfactory finished surfaces cannot be obtained.

The mechanical polishing ability depends largely on the abrasive, and inorganic particles such as silica and alumina particles have been commonly used in the prior art. Such inorganic particles must be stably dispersed in a slurry, but problems such as instability and aggregate formation sometimes occur because of reduced colloid stability due to additives such as polishing accelerators, sedimentation in a slurry during storage, and the like. The aggregates produce nicks (scratches) in the polishing surface, and this leads to reduced yields. However, no aqueous dispersion for CMP has yet been proposed that provides both the chemical etching ability described above and stability of the abrasive in the aqueous dispersion.

SUMMARY OF THE INVENTION

Problems to be Solved by the Invention

The present invention is aimed at overcoming the aforementioned problems of the prior art, and it provides an aqueous dispersion for CMP that has an excellent balance between chemical etching and mechanical polishing ability. That is, the object of the present invention is to provide an aqueous dispersion for CMP with a high removal rate that allows efficient polishing, while also producing minimal excessive etching, thinning, dishing, keyholes and scratches, to give finished surfaces with satisfactory high precision.

Features of the Invention

According to the present invention, an aqueous dispersion for CMP having constitution described below is provided to solve the above-mentioned objects.

[1] An aqueous dispersion for chemical mechanical polishing characterized by comprising an abrasive, water and a heteropolyacid.

[2] An aqueous dispersion for chemical mechanical polishing according to [1] above, characterized in that said heteropolyacid is at least one selected from among silicomolybdic acid, phosphorotungstic acid, silicotungstic acid, phosphoromolybdic acid and silicotungstomolybdic acid.

[3] An aqueous dispersion for chemical mechanical polishing according to [1] above, characterized by being used for polishing of a polishing surface with a tungsten film.

[4] An aqueous dispersion for chemical mechanical polishing according to [1] above, characterized by being used for polishing of a polishing surface with at least one from among copper films, aluminum films, ruthenium films, tantalum films, titanium films and platinum films.

[5] An aqueous dispersion for chemical mechanical polishing according to [1] above, characterized in that upon contact with the metal layer of a polishing surface, the etching rate of said metal layer is 100 Å/min or less.

[6] An aqueous dispersion for chemical mechanical polishing, characterized by comprising an abrasive, water, a heteropolyacid and an organic acid.

[7] An aqueous dispersion for chemical mechanical polishing according to [6] above, characterized in that said heteropolyacid is at least one selected from among silicomolybdic acid, phosphorotungstic acid, silicotungstic acid, phosphoromolybdic acid and silicotungstomolybdic acid.

[8] An aqueous dispersion for chemical mechanical polishing according to [6] above, characterized in that said organic acid has two or more carboxyl groups in one molecule.

[9] An aqueous dispersion for chemical mechanical polishing according to [8] above, characterized in that said organic acid is at least one selected from among oxalic acid, malonic acid, succinic acid, glutaric acid, adipic acid, maleic acid, fumaric acid, phthalic acid, malic acid, tartaric acid and citric acid.

[10] An aqueous dispersion for chemical mechanical polishing according to [6] above, characterized by being used for polishing of a polishing surface with a tungsten film.

[11] An aqueous dispersion for chemical mechanical polishing according to [6] above, characterized by being used for polishing of a polishing surface with at least one from among copper films, aluminum films, ruthenium films, tantalum films, titanium films and platinum films.

[12] An aqueous dispersion for chemical mechanical polishing, characterized by comprising colloidal silica with a primary particle size of 5–100 nm, water and a heteropolyacid.

[13] An aqueous dispersion for chemical mechanical polishing according to [12] above, characterized in that said colloidal silica is colloidal silica obtained by hydrolysis and condensation from an alkoxysilane.

[14] An aqueous dispersion for chemical mechanical polishing according to [12] above, characterized in that said heteropolyacid is at least one selected from among silicomolybdic acid, phosphorotungstic acid, silicotungstic acid, phosphoromolybdic acid and silicotungstomolybdic acid.

[15] An aqueous dispersion for chemical mechanical polishing according to [12] above, characterized by further comprising an organic acid.

[16] An aqueous dispersion for chemical mechanical polishing according to [12] above, characterized by being used for polishing of a polishing surface with a tungsten film.

[17] An aqueous dispersion for chemical mechanical polishing according to [12] above, characterized by being used for polishing of a polishing surface with at least one from among copper films, aluminum films, ruthenium films, tantalum films, titanium films and platinum films.

Effect of the Invention

The aqueous dispersion for CMP according to the invention has an excellent balance between chemical etching and mechanical polishing ability, and when used for polishing of polishing surfaces with metal layers it can give highly precise polished surfaces with no corrosion, dishing or keyholes on the polished surfaces. The aqueous dispersion for CMP according to the invention is therefore useful for CMP of polished surfaces with metal layers in manufacturing processes for semiconductor devices.

DETAILED DESCRIPTION OF THE INVENTION

The present invention will now be explained in further detail.

As the "abrasives" in the aqueous dispersions for CMP (hereunder referred to simply as "aqueous dispersions") according to the invention there may be used one or more types from among:

inorganic particles composed of silica, alumina, titania, zirconia, ceria or the like;

organic particles composed of styrene-based copolymers, acrylic copolymers or the like; and organic/inorganic composite particles composed of these organic particles and inorganic particles.

As inorganic particles there are preferred high-purity inorganic particles. Specific ones include particles of:

silica, alumina, titania or the like which are synthesized by a fumed method in which oxygen and hydrogen are reacted with silicon chloride, aluminum chloride or titanium chloride in a gas phase, silica, alumina or titania which are synthesized by a sol-gel method in which a metal alkoxide is hydrolyzed and condensation is carried out for the synthesis, and silica, alumina or titania which are synthesized by an inorganic colloid method in which the impurities are removed by purification.

As organic particles there may be used particles composed of:

(1) Polystyrene and styrene-based copolymers,
(2) (Meth)acrylic resins such as polymethyl methacrylate and (meth)acrylic copolymers,
(3) Polyvinyl chloride, polyacetal, saturated polyesters, polyamides, polyimides, polycarbonates and phenoxy resins, and
(4) Polyolefins such as polyethylene, polypropylene, poly-1-butene and poly-4-methyl-1-pentene, and olefin-based copolymers.

These organic particles may be produced by emulsion polymerization, suspension polymerization, emulsifying dispersion, pulverization and the like.

The organic particles used may be composed of a copolymer with a crosslinked structure, obtained by synthesis of the aforementioned polymers in the presence of divinyl benzene, ethyleneglycol dimethacrylate or the like. There may also be used organic particles composed of thermosetting resins such as phenol resins, urea resins, melamine resins, epoxy resins, alkyd resins and unsaturated polyester resins.

The aforementioned "organic/inorganic composite particles" may consist of organic particles and inorganic particles formed integrally to an extent so as not to easily separate during the CMP process, and there are no particular restrictions on their types or structures. As organic/inorganic composite particles (hereunder referred to as "composite particles") there may be used particles formed by polycondensation of an alkoxysilane, aluminum alkoxide, titanium alkoxide or the like in the presence of polymer particles of polystyrene, polymethyl methacrylate or the like, and bonding of polysiloxane or the like on at least the surface of the polymer particles. The resulting polycondensate may be directly bonded to the functional group of the polymer particles, or it may be bonded via a silane coupling agent or the like.

For production of the composite particles, silica particles or alumina particles may also be used instead of an alkoxysilane. These may be held by intertwining with the polysiloxane, or else they may be chemically bonded to the polymer particles by their functional groups, such as hydroxyl groups.

The composite particles may be the particles composed of organic particles and inorganic particles bonded by electrostatic force, which are formed from an aqueous dispersion containing organic particles and inorganic particles with zeta potentials of opposite signs.

The zeta potentials of organic particles are usually negative across the entire pH range, or across a wide pH range except for the low pH range; however, by using organic particles with carboxyl groups, sulfonic acid groups or the like, it is possible to obtain organic particles with a more definite negative zeta potential. Organic particles with amino groups and the like have a positive zeta potential in specific pH ranges.

On the other hand, the zeta potentials of inorganic particles are highly pH-dependent and have an isoelectric point at which the potential is zero; the sign of the zeta potential reverses at around that point.

Thus, by combining specific inorganic particles and organic particles and mixing them in a pH range at which their zeta potentials are opposite signs, it is possible to form an integral composite of the inorganic particles and organic particles by electrostatic force. Or, the zeta potentials may be of the same sign during the mixing, and the pH adjusted thereafter so that the zeta potentials of the inorganic particles and organic particles are of opposite signs, thereby allowing integration of the inorganic particles and organic particles.

The organic/inorganic composite particles used may be prepared by polycondensation of an alkoxysilane, aluminum alkoxide, titanium alkoxide or the like in the presence of the particles integrally composed in this manner by electrostatic force, and bonding of polysiloxane or the like on at least the surface of the particles to form a composite.

These abrasives normally exist in the aqueous dispersion as aggregates (secondary particles) composed of small particles (primary particles). The mean particle size of the secondary particles of the aforementioned abrasive is preferably "0.005–3 μm". A mean particle size of less than 0.005 μm will sometimes make it impossible to obtain an aqueous dispersion with an adequately high removal rate. On the other hand, a mean particle size of greater than 3 μm may result in precipitation and separation of the abrasive, hampering efforts to achieve a stable aqueous dispersion. The mean particle size is more preferably 0.01–1.0 μm and more preferably 0.02–0.7 μm. An abrasive with a mean secondary a mean particle size of the secondary particles in this range can give a stable aqueous dispersion for CMP that has a high removal rate without precipitation and separation of the particles. The mean particle size of the secondary particles may be measured by observation using a laser diffusion diffraction measuring instrument or a transmission electron microscope.

The abrasive content may be 0.05–20 wt %, more preferably 0.1–15 wt %, even more preferably 0.1–10 wt %, with respect to the total amount of the aqueous dispersion. If the abrasive content is less than 0.05 wt % the improvement in polishing performance will be insufficient, and if it is greater than 20 wt % the cost is increased and the stability of the aqueous dispersion is undesirably lowered.

For the aqueous dispersions of the invention, "colloidal silica" may be used as the abrasive. As the colloidal silica there may be used colloidal silica synthesized, for example, by a fumed method in which oxygen and hydrogen are reacted with silicon chloride or the like in a gas phase, a sol-gel method involving synthesis by hydrolysis and condensation from an alkoxysilane such as tetraethoxysilane, or an inorganic colloid method in which the impurities are removed by purification. Particularly preferred for use is colloidal silica synthesized by a sol-gel method involving synthesis by hydrolysis and condensation from an alkoxysilane such as tetraethoxysilane.

As alkoxysilanes there may be used, for example, tetramethoxysilane, tetraethoxysilane, tetra-n-propoxysilane, tetra-iso-propoxysilane, tetra-n-butoxysilane, tetra-iso-butoxysilane, methyltrimethoxysilane, methyltriethoxysilane, ethyltrimethoxysilane, ethyltriethoxysilane, n-propyltrimethoxysilane, n-propyltriethoxysilane, iso-propyltrimethoxysilane, iso-propyltriethoxysilane, n-butyltrimethoxysilane, iso-butyltrimethoxysilane, γ-chloropropyltrimethoxysilane, γ-chloropropyltriethoxysilane, 3,3,3-trifluoropropyltrimethoxysilane, 3,3,3-trifluoropropyltriethoxysilane, γ-glycidoxypropyltrimethoxysilane, γ-glycidoxypropyldimethoxyalkylsilane, γ-glycidoxypropyltriethoxysilane, γ-glycidoxypropyldiethoxyalkylsilane, γ-methacryloxypropyltrimethoxysilane, γ-methacryloxypropyltriethoxysilane, γ-mercaptopropyltrimethoxysilane, γ-mercaptopropyltriethoxysilane, γ-aminopropyltrimethoxysilane, γ-aminopropyltriethoxysilane, vinyltrimethoxysilane, vinyltriethoxysilane, phenyltrimethoxysilane, phenyltriethoxysilane, 3,4-epoxycyclohexylethyltrimethoxysilane, 3,4-epoxycyclohexylethyltriethoxysilane, dimethyldimethoxysilane, dimethyldiethoxysilane and diethyldimethoxysilane Particularly preferred among these are tetramethoxysilane, tetraethoxysilane, tetra-iso-propoxysilane, tetra-n-butoxysilane, tetra-iso-butoxysilane, methyltrimethoxysilane, methyltriethoxysilane, ethyltrimethoxysilane, ethyltriethoxysilane, n-propyltrimethoxysilane, n-propyltriethoxysilane, iso-propyltrimethoxysilane, iso-propyltriethoxysilane, n-butyltrimethoxysilane, dimethyldimethoxysilane, dimethyldiethoxysilane and diethyldimethoxysilane.

The primary particle size of the colloidal silica used in the aqueous dispersions of the invention is 5–100 nm, and preferably 5–50 nm. If the primary particle size of the colloidal silica is less than 5 nm it may not be possible to obtain sufficient mechanical polishing ability. On the other hand, if the primary particle size is greater than 100 nm scratches may tend to more readily occur, and the stability of the aqueous dispersion may be lowered.

Colloidal silica with a primary particle size in this range can give a stable aqueous dispersion for CMP with a high removal rate, minimal scratching and no precipitation or separation of particles.

The mean particle size of secondary particles formed of aggregates of the primary particles is preferably 10–200 nm and more preferably 10–100 nm. With a mean secondary particle size of less than 10 nm it may not be possible to obtain an aqueous dispersion with a sufficiently high removal rate. On the other hand, with a mean secondary particle size of greater than 200 nm, scratches may tend to more readily occur, and the stability of the aqueous dispersion may be lowered.

Colloidal silica with a mean secondary particle size in this range can give a stable aqueous dispersion for CMP with a high removal rate, minimal scratching and no precipitation or separation of particles.

One such type of colloidal silica may be used, or two or more different types with different primary particle sizes or secondary particle sizes may be used in combination.

The primary particle size may be calculated from the specific surface area by the BET method. The mean secondary particle size may be measured by observation using a laser diffusion diffraction measuring instrument or a transmission electron microscope.

The colloidal silica is preferably of high purity in order to avoid contamination of the polishing surface. Specifically preferred is colloidal silica with a sodium content of no greater than 10 ppm, preferably no greater than 8 ppm and especially no greater than 5 ppm. If the sodium content is greater than 10 ppm, the polishing surface may be contaminated by sodium during use of the CMP slurry.

The content of colloidal silica according to the invention maybe 0.05–20 wt %, preferably 0.1–15 wt % and more preferably 0.1–10 wt % with respect to the total amount of the aqueous dispersion. If the colloidal silica content is less than 0.05 wt % the improvement in polishing performance will be insufficient, and if it is greater than 20 wt % the cost is increased and the stability of the aqueous dispersion is undesirably lowered.

The medium for the aqueous dispersion of the invention may be water or a mixed medium composed mostly of water (such as a mixture of water and methanol), but water alone is particularly preferred.

As the "heteropolyacid" to be included in the aqueous dispersion of the invention there may be used an acid produced by two or more metals among polyacids formed by condensation of inorganic acids. As the main atoms of the polyacid forming the heteropolyacid there may be mentioned Cu, Be, B, Al, C, Si, Ge, Sn, Ti, Zr, Ce, Th, N, P, As, Sb, V, Nb, Ta, Cr, Mo, W, U, S, Se, Te, Mn, I, Fe, Co, Ni, Rh, Os, Ir and Pt. Among these are preferred V, Mo and W.

As the heteroatom to be combined with the aforementioned main atom there may be used a metal from among Cu, Be, B, Al, C, Si, Ge, Sn, Ti, Zr, Ce, Th, N, P, As, Sb, V, Nb, Ta, Cr, Mo, W, U, S, Se, Te, Mn, I, Fe, Co, Ni, Rh, Os, Ir and Pt, which is different from the aforementioned main atom, and Si and P are preferred.

As specific examples of heteropolyacids there may be mentioned silicomolybdic acid, phosphoromolybdic acid, silicotungstic acid, phosphorotungstic acid and silicotungstomolybdic acid.

For polishing of polishing surfaces with tungsten films, silicomolybdic acid, phosphoromolybdic acid and silicotungstomolybdic acid are particularly preferred.

The amount of the heteropolyacid to be used for the aqueous dispersions may be 0.1–15 wt %, preferably 0.2–10 wt %, more preferably 0.5–8 wt %, even more preferably 2–8 wt % with respect to the total of the aqueous dispersion.

If the heteropolyacid content is less than 0.1 wt % the removal rate of the aqueous dispersion will not be adequately increased. However, sufficient improvement in the removal rate is achieved with a content of 15 wt %. At greater than 15 wt %, corrosion occurs in polishing surfaces and an undesirable risk is therefore posed in terms of handling.

The heteropolyacid may also be used in combination with a base to form a salt. Alternatively, the heteropolyacid and/or its salt may be dissociated either partially or completely in the aqueous dispersion to include ions.

The aqueous dispersions for CMP of the invention can exhibit high performance by containing only the aforementioned abrasive, water and heteropolyacid, but depending on the purpose they may also contain other additives. Such additives include oxidizing agents other than the heteropolyacid, acids other than the heteropolyacid, bases, surfactants, viscosity adjustors, and the like.

By including an "acid" it is possible to further improve the dispersability, stability and removal rate of the aqueous dispersion. The acid is not particularly restricted, and any organic acid or inorganic acid may be used.

As organic acids there may be mentioned para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. Preferred among these are organic acids with at least two carboxyl groups in one molecule. As specific examples of preferred organic acids there may be mentioned oxalic acid, malonic acid, succinic acid, glutaric acid, adipic acid, maleic acid, fumaric acid, phthalic acid, malic acid, tartaric acid and citric acid. These organic acids may be used alone or in combinations of two or more.

As inorganic acids there may be mentioned nitric acid, hydrochloric acid and sulfuric acid, and any one or more of these may be used. An organic acid and an inorganic acid may also be used in combination.

The contents of these acids may be up to 10 wt %, preferably 0.005–10 wt %, more preferably 0.01–8 wt %, and especially from 1–8 wt % with respect to the total of the aqueous dispersion. With an organic acid content within these ranges it is possible to provide an aqueous dispersion with excellent dispersability and sufficient stability, while it is also preferred from the standpoint of minimizing etching.

As "oxidizing agents" there may be used those selected as appropriate depending on the electrochemical properties of the metal layer of the polishing surface, based on a Pourbaix diagram, for example. As examples of specific oxidizing agents there may be mentioned, hydrogen peroxide;

organic peroxides such as peracetic acid, perbenzoic acid, tert-butylhydroperoxide;

permanganate compounds such as potassium permanganate;

bichromate compounds such as potassium bichromate;

halogenate compounds such as potassium iodate;

nitric compounds such as nitric acid, iron nitrate;

perhalogenate compounds such as perchloric acid;

transition metal salts such as potassium ferricyanide; and persulfuric compounds such as ammonium persulfate.

The content of the oxidizing agent for the aqueous dispersions of the invention may be up to 15 wt %, preferably no greater than 10 wt % and more preferably no greater than 8 wt % with respect to the total of the aqueous dispersion. When included at greater than 15 wt %, corrosion occurs in polishing surfaces and an undesirable risk is therefore posed in terms of handling. Though the lower limit is not restricted, to exhibit sufficient effect the content of the oxidizing agent may normally be 1 wt % or more, preferably 2 wt % or more.

The aqueous dispersion for CMP according to the invention may also contain a "base" for control of the pH to improve the dispersability, corrosion resistance, stability and removal rate of the aqueous dispersion. The base is not particularly restricted, and any organic base or inorganic base may be used. As organic bases there may be mentioned ethylenediamine and ethanolamine. As inorganic bases there may be mentioned ammonia, potassium hydroxide, sodium hydroxide and lithium hydroxide, and these bases may be used alone or in combinations of two or more.

The base contents for the aqueous dispersions of the invention may be up to 10 wt %, and preferably from 0.01 to 8 wt %, more preferably from 1 to 8 wt % with respect to the total of the aqueous dispersion.

As "surfactants" there may be used cationic surfactants, anionic surfactants or non-ionic surfactants. As cationic surfactants there may be mentioned fatty amines, aliphatic ammonium salts and the like. As anionic surfactants there may be mentioned carboxylic acid salts such as fatty acid soaps and alkylether carboxylic acid salts, sulfonic acid salts such as alkylbenzenesulfonic acid salts, alkylnaphthalene-sulfonic acid salts and α-olefinsulfonic acid salts, sulfuric acid ester salts such as higher alcohol sulfuric acid ester salts and alkylether sulfuric acid salts, and phosphoric acid ester salts such as alkylphosphoric acid ester salts. As non-ionic surfactants there may be mentioned ethers such as polyoxyethylene alkyl ether, ether esters such as polyoxyethylene ethers of glycerin esters, and esters such as polyethylene glycol fatty acid esters, glycerin esters and sorbitan esters.

The surfactant content may be up to 5 wt %, preferably no greater than 3 wt % and more preferably no greater than 1 wt % with respect to the total of the aqueous dispersion. If the surfactant content is greater than 5 wt %, the polishing performance may be undesirably lowered.

The polishing surface with a metal layer to be polished using an aqueous dispersion for CMP according to the invention may be a polishing surface with at least one type of metal layer from among pure tungsten films, pure aluminum films, pure copper films, pure ruthenium films, pure tantalum films, pure titanium films and pure platinum films, as well as alloy films of tungsten, aluminum, copper, ruthenium, tantalum, titanium or platinum with another metals, that are formed on semiconductor bases in manufacturing processes for semiconductor devices such as VLSIs and the like. In addition to these metal layers, tantalum nitride, titanium nitride and polysilicon layers that are used for barrier metal layers may also be present in the polishing surface.

The aqueous dispersion of the invention may employ an appropriate composition suited for the purpose, and when the aqueous dispersion is contacted with a metal layer of a working surface, the "etching rate" of the metal layer is preferably "no greater than 100 Å/min". The etching rate is preferably no greater than 60 Å/min, and especially no greater than 40 Å/min. The etching rate may be adjusted by adjusting the oxidizing agent content, the acid content and the base content. The etching rate can be measured by an appropriate method, but it is preferably measured by immersing the wafer with the working surface in the aqueous dispersion at 5–40° C., ordinary pressure for 5–30 minutes, and then determining the amount of loss of the film thickness of the metal layer.

According to the invention, the etching rate is adjusted by adjusting the composition and pH of the aqueous dispersion to produce an aqueous dispersion for CMP having the desired polishing performance.

CMP of a polishing surface using an aqueous dispersion for CMP according to the invention can be polished under the prescribed polishing conditions with a commercially available chemical mechanical polishing apparatus (such as Model "LGP510" or "LGP552" by Lapmaster SFT Co., Ltd.; Model "EPO-112", "EPO-113" and "EPO-222" by Ebara Corp.; Model "Mirra" by Applied Materials Corp.; and Model "AVANTI-472" by AIPEC Corp.).

It is preferred for the abrasive remaining on the polishing surface to be removed after polishing. The abrasive may be removed by a common washing method. When the abrasive consists of only organic particles, the polishing surface may be heated to high temperature in the presence of oxygen to burn off the organic abrasives for their removal. The specific burning method used may be an ashing treatment method with plasma whereby oxygen radicals are supplied in a downflow for exposure to oxygen plasma; this allows the residual organic abrasives to be easily removed from the polishing surface.

Embodiments of the Invention

The present invention will now be explained in greater detail by way of examples.

(1) Experimental Example 1

Aqueous dispersions for CMP were prepared for Examples 1A to 19A and Comparative Examples 1A to 4A, and were evaluated.

Example 1A

There was prepared 100 parts by weight (hereunder referred to simply as "parts") of an aqueous dispersion for CMP in which 5 parts of silicomolybdic acid was dissolved and 5 parts of fumed silica (#90, product of Nippon Aerosil Co., Ltd.) was dispersed. The pH of the aqueous dispersion was 1.5.

A blanket wafer ("W-Blanket", product of SKW Associates Corp.) with a tungsten layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 12 Å/min. Also, an 8-inch thermal oxidation film-coated silicon wafer coating film (product name: "W-Blanket", film thickness: 10,000 Å, product of SKW Associates Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm$^2$. The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 2700 Å/min. To evaluate the uniformity, the within wafer non-uniformity (WIWNU) was measured by 49 point diameter scan, 3 mm edge exclusion, resulted in that 3 σ was 8.5%. For evaluation of the corrosion, patterned wafers with a 0.28 μm diameter contact hole were 30% over-polished and the number of keyholes observed; only two keyholes were found out of 100 contact holes.

Examples 2A–10A and Comparative Examples 1A and 2A

The abrasive, heteropolyacid and pH were changed as shown in Table 1, and the etching rates and polishing performance on tungsten

TABLE 1

| | abrasive types (content) | heteropolyacid types (content) | pH | etching rate (Å/min) | removal rate (Å/min) | number of keyholes | dishing (Å) | uniformity WIWNU 3 σ(%) |
|---|---|---|---|---|---|---|---|---|
| Examples | | | | | | | | |
| 1A | #90 fumed silica (5 parts) | silicomolybdic acid (5 parts) | 1.5 | 12 | 2700 | 2 | 650 | 8.5 |
| 2A | #90 fumed silica (5 parts) | silicomolybdic acid (5 parts) | 2.2 | 12 | 2700 | 1 | 720 | 8.4 |
| 3A | #90 fumed silica (5 parts) | silicomolybdic acid (5 parts) | 3.1 | 12 | 2700 | 3 | 690 | 9.2 |
| 4A | #90 fumed silica (5 parts) | silicomolybdic acid (5 parts) | 4.1 | 12 | 2700 | 0 | 740 | 8.2 |

TABLE 1-continued

|  | abrasive types (content) | heteropolyacid types (content) | pH | etching rate (Å/min) | removal rate (Å/min) | number of keyholes | dishing (Å) | uniformity WIWNU 3 σ(%) |
|---|---|---|---|---|---|---|---|---|
| 5A | #90 fumed silica (5 parts) | silicomolybdic acid (5 parts) | 5.2 | 20 | 2700 | 2 | 920 | 9.6 |
| 6A | #90 fumed silica (5 parts) | silicomolybdic acid (5 parts) | 6.4 | 34 | 2700 | 5 | 1070 | 11.6 |
| 7A | #90 fumed silica (5 parts) | phosphoromolybdic acid (5 parts) | 4.2 | 18 | 2100 | 4 | 830 | 12.3 |
| 8A | high purity colloidal silica (5 parts) | silicomolybdic acid (5 parts) | 4.3 | 31 | 2100 | 6 | 790 | 14.9 |
| 9A | fumed alumina (5 parts) | silicomolybdic acid (5 parts) | 4.1 | 12 | 2300 | 0 | 610 | 18.9 |
| 10A | 0.2 μm PMMA particle (5 parts) | silicomolybdic acid (5 parts) | 4.1 | 12 | 1900 | 0 | 820 | 12.9 |
| Comparative Examples | | | | | | | | |
| 1A | #90 fumed silica (5 parts) | hydrogen peroxide (5 parts) | 4.1 | 110 | 1600 | 32 | 2310 | 11.5 |
| 2A | #90 fumed silica (5 parts) | molybdic acid (5 parts) | 1.5 | 12 | 50 | — | — | — | films were evaluated in the same manner as Example 1A. The results are shown in Table 1. The pH was adjusted by addition of KOH where necessary.

According to the results in Table 1, the etching rates were 34 Å/min or less in Examples 1A to 10A. The removal rates were 1900 Å/min or greater, which were sufficient rates of polishing. Few or no keyholes were found due to corrosion, and thus no problem was posed. On the other hand, Comparative Example 1A exhibited the problem of numerous keyholes due to corrosion, while Comparative Example 2A exhibited the problem of an insufficient rate of polishing.

Example 11A

There was prepared 100 parts of an aqueous dispersion for CMP adjusted to pH 4 with KOH, in which 2 parts of silicomolybdic acid was dissolved and 1 part of fumed silica (#90, product of Nippon Aerosil Co., Ltd.) was dispersed.

A blanket wafer ("Cu-Blanket", product of IMAT Corp.) with a copper layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 14 Å/min. Also, an 8-inch thermal oxidation film-coated silicon wafer coating copper film (product name: "Cu-Blanket", film thickness: 10,000 Å, product of IMAT Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm$^2$. The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 4900 Å/min. The WIWNU was measured by the same method as Example 1A, resulted in that 3 σ was 21%. For evaluation of the corrosion, patterned wafers with a 0.28 μm diameter contact hole were 30% over-polished and the number of keyholes observed; no keyholes were found out of 100 contact holes. A wiring-patterned wafer (SKW6-2, product of SKW Corp.) was also 30% over-polished, and the dishing of a 100 μm wiring width was evaluated to be a satisfactory 800 Å.

Examples 12A–19A and Comparative Examples 3A and 4A

The heteropolyacid, pH and abrasive were changed as shown in Table 2, and the etching rates and polishing performance on copper films were evaluated in the same manner as Example 11A. The results are shown in Table 2. The pH was adjusted by addition of KOH where necessary.

According to the results in Table 2, the etching rates were 23 Å/min or less in Examples 11A to 19A. The removal rates were 2900 Å/min or greater, which were sufficient rates of polishing. Also, few or no keyholes were found due to corrosion, and thus no problem was posed. On the other hand, Comparative Example 3A exhibited the problem of numerous keyholes due to corrosion, while Comparative Example 4A exhibited the problem of an insufficient rate of polishing.

TABLE 2

|  | abrasive types (content) | heteropolyacid types (content) | pH | etching rate (Å/min) | removal rate (Å/min) | number of keyholes | dishing (Å) | uniformity WIWNU 3 σ(%) |
|---|---|---|---|---|---|---|---|---|
| Examples | | | | | | | | |
| 11A | #90 fumed silica (1 part) | silicomolybdic acid (2 parts) | 4 | 14 | 4900 | 0 | 800 | 21 |
| 12A | #90 fumed silica (1 part) | silicotungstic acid (2 parts) | 4 | 18 | 3900 | 2 | 300 | 28 |

TABLE 2-continued

|  | abrasive types (content) | heteropolyacid types (content) | pH | etching rate (Å/min) | removal rate (Å/min) | number of keyholes | dishing (Å) | uniformity WIWNU 3 σ(%) |
|---|---|---|---|---|---|---|---|---|
| 13A | #90 fumed silica (1 part) | phosphoromolybdic acid (2 parts) | 4 | 23 | 5200 | 3 | 630 | 28 |
| 14A | #90 fumed silica (1 part) | phosphorotungstic acid (2 parts) | 4 | 17 | 4800 | 0 | 550 | 18 |
| 15A | #90 fumed silica (1 part) | silicomolybdic acid (2 parts) | 4.5 | 20 | 6200 | 2 | 680 | 19 |
| 16A | #90 fumed silica (1 part) | silicomolybdic acid (2 parts) | 5 | 6 | 5500 | 1 | 390 | 21 |
| 17A | high purity colloidal silica (1 part) | silicomolybdic acid (2 parts) | 4 | 17 | 7100 | 0 | 820 | 44 |
| 18A | fumed alumina (1 part) | silicomolybdic acid (2 parts) | 4 | 21 | 6900 | 2 | 1020 | 21 |
| 19A | 0.2 μm polystyrene particle (1 part) | silicomolybdic acid (2 parts) | 4 | 21 | 2900 | 1 | 990 | 19 |
| Comparative Examples | | | | | | | | |
| 3A | #90 fumed silica (1 part) | hydrogen peroxide (2 parts) | 4 | 110 | 1600 | 32 | 1300 | 93 |
| 4A | #90 fumed silica (1 part) | molybdic acid (2 parts) | 4 | 12 | 85 | — | — | — |

(2) Experimental Example 2

Aqueous dispersions for CMP were prepared for Examples 1B to 15B and Comparative Examples 1B to 5B, and were evaluated.

Example 1B

An aqueous dispersion for CMP was prepared by dissolving 5 wt % of silicomolybdic acid (product of Wako Junyaku Co., Ltd.) and 1 wt % of oxalic acid (product of Wako Junyaku Co., Ltd.) in water and further dispersing 5 wt % of fumed silica (#90, product of Nippon Aerosil Co., Ltd.). The pH of the aqueous dispersion was 1.5.

A blanket wafer ("W-Blanket", product of SKW Associates Corp.) with a tungsten layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 13 Å/min. Also, an 8-inch thermal oxidation film-coated silicon wafer coating film (product name: "W-Blanket", film thickness: 10,000 Å, product of SKW Associates Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm². The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 2900 Å/min. The WIWNU was measured by the same method as Example 1A, resulted in that 3 σ was 8.5%. For evaluation of the corrosion, patterned wafers with a 0.28 μm diameter contact hole were 30% over-polished and the number of keyholes observed; only two keyholes were found out of 100 contact holes.

A wiring-patterned wafer ("SKW5", product of SKW Corp.) was also 30% over-polished, and the dishing of a 100 μm wiring width was evaluated to be a satisfactory 500 Å.

Examples 2B–6B and Comparative Examples 1B, 2B

The abrasive, heteropolyacid or other oxidizing agent, as well as the type and amount of organic acid and the pH, were changed as shown in Table 3, and the etching rates and polishing performance on tungsten films were evaluated in the same manner as Example 1B. The results are shown in Table 3.

The high purity colloidal silica used for Examples 2B and 4B, the fumed alumina used for Example 5B and the polymethyl methacrylate particles used for Example 6B were obtained by the methods described below. The phosphoromolybdic acid used was a product of Wako Junyaku Co., Ltd. The pH was also adjusted by addition of KOH where necessary.

Synthesis of High Purity Colloidal Silica
(Examples 2B, 4B)

The high purity colloidal silica used was prepared by solvent replacement of a condensate of tetraethoxysilane in an ethanol/water mixed solvent using ammonia as the catalyst in water, as described in J. of Colloid and Interface Science, 26, 62–69(1968). Two types of high purity colloidal silica with particle sizes of 39 nm and 67 nm were synthesized by changing the ethanol/water ratio.

Fumed Alumina (Example 5B)

A dispersion of "Alumina C" (trade name of Degusa Corp.) was used.

Synthesis of 0.2 μm Polymethyl Methacrylate
(Example 6B)

After loading 96 parts of methyl methacrylate, 4 parts of methacrylic acid, 0.1 part of ammonium lauryl sulfate, 0.5 part of ammonium persulfate and 400 parts of ion-exchanged water into a 2-liter flask, the temperature was raised to 70° C. while stirring in a nitrogen gas atmosphere, for 6 hours of polymerization. This yielded an aqueous dispersion comprising carboxyl group-containing anionic polymethyl methacrylate polymer fine particles with a mean particle size of 0.2 μm (hereunder referred to as "0.2 μm PMMA particles"). The polymerization yield was 95%.

at 25° C. for 30 minutes, and the film thickness loss after 30 minutes was determined by measuring the sheet resistance

TABLE 3

|  | abrasive types (content) | heteropolyacid types (content) | other oxidizing agent (content) |
|---|---|---|---|
| Examples | | | |
| 1B | #90 fumed silica (5 wt %) | silicomolybdic acid (5 wt %) | — |
| 2B | high purity colloidal silica 39 nm (1 wt %) | silicomolybdic acid (3 wt %) | — |
| 3B | #90 fumed silica (5 wt %) | silicomolybdic acid (2 wt %) | — |
| 4B | high purity colloidal silica 67 nm (3 wt %) | phosphoromolybdic acid (1 wt %) | — |
| 5B | fumed alumina (5 wt %) | silicomolybdic acid (1 wt %) | — |
| 6B | 0.2 μm PMMA particle (5 wt %) | silicomolybdic acid (5 wt %) | — |
| Comparative Examples | | | |
| 1B | #90 fumed silica (5 wt %) | — | hydrogen peroxide (5 wt %) |
| 2B | #90 fumed silica (5 wt %) | — | molybdic acid (5 wt %) |

|  | organic acid types (content) | pH | etching rate (Å/min) | removal rate (Å/min) | number of keyholes | dishing (Å) | uniformity WIWNU 3 σ(%) |
|---|---|---|---|---|---|---|---|
| Examples | | | | | | | |
| 1B | oxalic acid (1 wt %) | 1.5 | 13 | 2900 | 2 | 500 | 8.5 |
| 2B | malonic acid (0.5 wt %) | 4.1 | 12 | 3000 | 0 | 630 | 8.2 |
| 3B | maleic acid (2 wt %) | 5.2 | 20 | 3200 | 2 | 800 | 9.6 |
| 4B | phthalic acid (0.5 wt %) | 4.2 | 17 | 2500 | 3 | 800 | 10.3 |
| 5B | oxalic acid (1 wt %) | 4.1 | 12 | 2400 | 0 | 520 | 15.9 |
| 6B | fumaric acid (2 wt %) | 4.1 | 10 | 2000 | 0 | 700 | 12.9 |
| Comparative Examples | | | | | | | |
| 1B | oxalic acid (1 wt %) | 4.1 | 120 | 1600 | 35 | 2300 | 11.5 |
| 2B | malonic acid (1 wt %) | 1.5 | 12 | 50 | — | — | — |

According to the results in Table 3, the etching rates were 20 Å/min or less in Examples 1B to 6B. The removal rates were 2000 Å/min or greater, which were sufficient rates of polishing. Also, few or no keyholes were found due to corrosion, and thus no problem was posed. On the other hand, Comparative Example 1B exhibited the problem of numerous keyholes due to corrosion, while Comparative Example 2B exhibited the problem of an insufficient rate of polishing, and evaluation of the keyholes, dishing and in-plane homogeneity was not possible.

Example 7B

An aqueous dispersion for CMP adjusted to pH 4 with KOH was prepared by dissolving 2 wt % of silicomolybdic acid (product of Wako Junyaku Co., Ltd.) in water and 1 wt % of maleic acid (product of Wako Junyaku Co., Ltd.) and further dispersing 1 wt % of fumed silica (#90, product of Nippon Aerosil Co., Ltd.).

A blanket wafer ("Cu-Blanket", product of IMAT Corp.) with a copper layer was immersed in the aqueous dispersion with a resistance measuring instrument (Model Sigma 5, product of NSP Corp.) according to the 4-probe method; the etching rate was calculated and found to be 12 Å/min. Also, an 8-inch thermal oxidation film-coated silicon wafer coating copper film (product name: "Cu-Blanket", film thickness: 10,000 Å, product of IMAT Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm². The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 5300 Å/min. The WIWNU was measured by the same method as Example 1A, resulted in that 3 σ was 18.0%. For evaluation of the corrosion, patterned wafers with a 0.28 μm diameter contact hole were 30% over-polished and the number of keyholes observed; no keyholes were found out of 100 contact holes. A wiring-patterned wafer (SKW6-2, product of SKW Corp.) was also 30% over-polished, and the dishing of a 100 μm wiring width was evaluated to be a satisfactory 600 Å.

Examples 8B-12B and Comparative Examples 3B, 4B

The abrasive, heteropolyacid or other oxidizing agent, as well as the type and amount of organic acid and the pH, were The pH was also adjusted by addition of KOH where necessary.

According to the results in Table 4, the etching rates were 21 Å/min or less in Examples 7B to 12B. The removal rates were 2900 Å/min or greater, which were sufficient rates of polishing. Also, few or no keyholes were found due to corrosion, and thus no problem was posed. On the other hand, Comparative Example 3B exhibited the problem of numerous keyholes due to corrosion, while Comparative Example 4B exhibited the problem of an insufficient rate of polishing, and evaluation of the keyholes, dishing and in-plane homogeneity was not possible.

TABLE 4

|  | abrasive types (content) | heteropolyacid types (content) | other oxidizing agent (content) |
|---|---|---|---|
| Examples | | | |
| 7B | #90 fumed silica (1 wt %) | silicomolybdic acid (2 wt %) | — |
| 8B | high purity colloidal silica 39 nm (1 wt %) | silicotungstic acid (2 wt %) | — |
| 9B | #90 fumed silica (2 wt %) | phosphoromolybdic acid (2.5 wt %) | — |
| 10B | high purity colloidal silica 67 nm (2.5 wt %) | silicomolybdic acid (0.5 wt %) | — |
| 11B | fumed alumina (1 wt %) | silicomolybdic acid (1 wt %) | — |
| 12B | 0.2 μm PMMA particle (1 wt %) | silicomolybdic acid (2 wt %) | — |
| Comparative Examples | | | |
| 3B | #90 fumed silica (1 wt %) | — | hydrogen peroxide (2 wt %) |
| 4B | #90 fumed silica (1 wt %) | — | molybdic acid (2 wt %) |

|  | organic acid types (content) | pH | etching rate (Å/min) | removal rate (Å/min) | number of keyholes | dishing (Å) | uniformity WIWNU 3 σ(%) |
|---|---|---|---|---|---|---|---|
| Examples | | | | | | | |
| 7B | maleic acid (1 wt %) | 4 | 12 | 5300 | 0 | 600 | 18.0 |
| 8B | oxalic acid (0.5 wt %) | 4 | 15 | 5200 | 0 | 550 | 15.3 |
| 9B | malonic acid (2 wt %) | 4.5 | 20 | 6200 | 2 | 800 | 19.2 |
| 10B | phthalic acid (1.5 wt %) | 4 | 16 | 7000 | 0 | 910 | 33.3 |
| 11B | phthalic acid (1.5 wt %) | 4 | 21 | 4800 | 1 | 1050 | 20.8 |
| 12B | maleic acid (3 wt %) | 4 | 20 | 2900 | 1 | 880 | 15.5 |
| Comparative Examples | | | | | | | |
| 3B | maleic acid (1 wt %) | 4 | 120 | 1800 | 32 | 1350 | 90.8 |
| 4B | maleic acid (1 wt %) | 4 | 12 | 90 | — | — | — | changed as shown in Table 4, and the etching rates and polishing performance on copper films were evaluated in the same manner as Example 7B. The results are shown in Table 4.

The high purity colloidal silica, fumed alumina and 0.2 μm PMMA particles were obtained by the same method as those in Table 3. The silicomolybdic acid used was a product of Wako Junyaku Co., Ltd.

Example 13B

An aqueous dispersion for CMP adjusted to pH 4 with KOH was prepared by dissolving 4 wt % of silicomolybdic acid (product of Wako Junyaku Co., Ltd.) and 1 wt % of malonic acid (product of Wako Junyaku Co., Ltd.) in water and further dispersing 2 wt % of fumed alumina ("Alumina C", product of Degusa Corp.).

A blanket wafer with an aluminum layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 10 Å/min. Also, an 8-inch thermal oxidation film-coated silicon wafer coating aluminum film (film thickness: 6,000 Å) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm². The urethane pad surface was subjected to one minute of rotary polishing with the table at 100 rpm and the head at 100 rpm while supplying the aqueous dispersion at a rate of 200 cc/min. As a result, the removal rate as measured with an Omnimap RS-75 (product of KLA-Tencor Corp.) was 3900 Å/min. The WIWNU was measured by the same method as Example 1A, resulted in that 3 σ was 15.3%. For evaluation of the corrosion, patterned wafers with a 0.28 μm diameter contact hole were 30% over-polished and the number of keyholes observed; no keyholes were found out of 100 contact holes. A wiring-patterned wafer was also 30% over-polished, and the dishing of a 100 μm wiring width was evaluated to be a satisfactory 900 Å.

Examples 14B–15B, Comparative Example 5B

The abrasive, heteropolyacid or other organic acid, as well as the type and amount of organic acid and the pH, were changed as shown in Table 5, and the etching rates and polishing performance on copper films were evaluated in the same manner as Example 13B. The results are shown in Table 5.

TABLE 5

| | abrasive types (content) | heteropolyacid types (content) | other oxidizing agent (content) |
|---|---|---|---|
| Examples | | | |
| 13B | fumed alumina (2 wt %) | silicomolybdic acid (4 wt %) | — |
| 14B | fumed alumina (1 wt %) | silicotungstic acid (2 wt %) | — |
| 15B | high purity colloidal silica 67 nm (3 wt %) | silicomolybdic acid (2.5 wt %) | — |
| Comparative Examples | | | |
| 3B | fumed alumina (2 wt %) | — | molybdic acid (4 wt %) |

| | organic acid types (content) | pH | etching rate (Å/min) | removal rate (Å/min) | number of keyholes | dishing (Å) | uniformity WIWNU 3 σ(%) |
|---|---|---|---|---|---|---|---|
| Examples | | | | | | | |
| 13B | malonic acid (1 wt %) | 4 | 10 | 3900 | 0 | 900 | 15.3 |
| 14B | oxalic acid (0.5 wt %) | 3.5 | 17 | 3800 | 0 | 550 | 25.1 |
| 15B | maleic acid (2 wt %) | 4.8 | 25 | 2800 | 2 | 700 | 30.3 |
| Comparative Examples | | | | | | | |
| 3B | malonic acid (1 wt %) | 4 | 12 | 85 | — | — | — |

The high purity colloidal silica and phosphoromolybic acid were obtained by the same method as those in Table 3. The pH was also adjusted by addition of KOH where necessary.

According to the results in Table 5, the etching rates were 25 Å/min or less in Examples 13B to 15B. The removal rates were 2800 Å/min or greater, which were sufficient rates of polishing. Also, few or no keyholes were found due to corrosion, and thus no problem was posed. On the other hand, Comparative Example 5B exhibited the problem of an insufficient rate of polishing, and evaluation of the keyholes, dishing and in-plane homogeneity was not possible.

(3) Experimental Example 3

Aqueous dispersions for CMP were prepared for Examples 1C to 11C and Comparative Examples 1C to 5C, and were evaluated.

Synthesis of Colloidal Silica

The colloidal silica used was prepared by solvent replacement of a condensate of tetraethoxysilane in an ethanol/water mixed solvent using ammonia as the catalyst in water, as described in J. of Colloid and Interface Science, 26, 62–69 (1968), after concentration. Three types of high purity colloidal silica with mean secondary particle sizes of 39 nm, 67 nm and 125 nm were synthesized by changing the ethanol/water ratio, the ammonia content and the reaction temperature. Calculation of the primary particle sizes from the specific surface areas of each colloidal silica measured by the BET method gave values of 15 nm, 35 nm and 75 nm.

Measurement of the sodium content of each colloidal silica by the atomic absorption method gave values of 1 ppm, 0.7 ppm and 0.9 ppm.

Example 1C

An aqueous dispersion for CMP was prepared by dissolving 3 wt % of silicomolybdic acid (product of Wako Junyaku Co., Ltd.) in water and further dispersing 5 wt % of colloidal silica with a primary particle size of 15 nm. The pH of the aqueous dispersion was 1.9.

A blanket wafer("W-Blanket", product of SKW Associates Corp.) with a tungsten layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 12 Å/min. Also, an 8-inch thermal oxidation film-coated silicon wafer coating film (product name: "W-Blanket", film thickness: 10,000 Å, product of SKW Associates Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm$^2$. The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 2500 Å/min. The WIWNU was measured by the same method as Example 1A, resulted in that 3 σ was 9.2%. Also, the number of scratches (Kt) produced on the entire polishing surface (represented as "St", units: mm$^2$) was measured with a wafer surface matter scanning apparatus ("Surfacescan SP1", product of KLA Tencor Co., Ltd.), and calculation of the number of scratches per unit area (10$^{-2}$ mm$^2$, 100×100 μm square region) according to the formula given below yielded a result of one scratch per unit area.

Scratch Counting Method

Number of scratches per unit area=Kt/(St/10$^{-2}$)

For evaluation of the corrosion, patterned wafers with a 0.28 μm diameter contact hole were 30% over-polished and the number of keyholes observed; no keyholes were found out of 100 contact holes. A wiring-patterned wafer (SKW5, product of SKW Corp.) was also 30% over-polished, and the dishing of a 100 μm wiring width was evaluated to be a satisfactory 780 Å.

TABLE 6

|  | abrasive types (primary particle size) (content) | heteropolyacid types (content) | other oxidizing agent (content) | organic acid types (content) |
|---|---|---|---|---|
| Examples |  |  |  |  |
| 1C | colloidal silica(15 nm) (5 wt %) | silicomolybdic acid (3 wt %) | — | — |
| 2C | colloidal silica(15 nm) (1.5 wt %) | silicomolybdic acid (4 wt %) | — | malonic acid (0.5 wt %) |
| 3C | colloidal silica(35 nm) (3 wt %) | silicomolybdic acid (1.5 wt %) | — | maleic acid (2 wt %) |
| 4C | colloidal silica(75 nm) (1 wt %) | phosphoromolybdic acid (2 wt %) | — | — |
| Comparative Examples |  |  |  |  |
| 1C | colloidal silica(15 nm) (5 wt %) | — | hydrogen peroxide (3 wt %) | — |
| 2C | fumed alumina(13 nm) (1.5 wt %) | silicomolybdic acid (4 wt %) | — | malonic acid (0.5 wt %) |

|  | pH | etching rate (Å/min) | removal rate (Å/min) | number of keyholes | dishing (Å) | uniformity WIWNU 3 σ(%) | number of scraches |
|---|---|---|---|---|---|---|---|
| Examples |  |  |  |  |  |  |  |
| 1C | 1.9 | 12 | 2500 | 0 | 780 | 9.2 | 1 |
| 2C | 4.5 | 14 | 3200 | 3 | 500 | 8.0 | 3 |
| 3C | 5.0 | 20 | 3000 | 0 | 820 | 11.3 | 0 |
| 4C | 3.8 | 18 | 2100 | 1 | 980 | 12.3 | 10 |
| Comparative Examples |  |  |  |  |  |  |  |
| 1C | 1.9 | 100 | 1500 | 30 | 1900 | 18.5 | 4 |
| 2C | 4.5 | 12 | 2400 | 0 | 520 | 9.9 | 59 |

Examples 2C–4C and Comparative Examples 1C, 2C

The colloidal silica, heteropolyacid or other oxidizing agent, as well as the type and amount of organic acid and the pH, were changed as shown in Table 6, and the etching rates and polishing performance on tungsten films were evaluated in the same manner as Example 1C. The results are shown in Table 6.

The pH was also adjusted by addition of KOH where necessary.

The phosphoromolybdic acid used for Example 4C was a product of Wako Junyaku Co., Ltd. The fumed alumina used for Comparative Example 2C was prepared by dispersion of "Alumina C" (product of Degusa Corp., primary particle size: 13 nm).

According to the results in Table 6, the etching rates were 20 Å/min or less in Examples 1C to 4C. The removal rates were 2100 Å/min or greater, which were sufficient rates of polishing. Also, there were few or no scratches or keyholes due to corrosion, and thus no problem was posed. On the other hand, Comparative Example 1C exhibited the problem of a high etching rate, considerable dishing and a large number of keyholes due to corrosion, while Comparative Example 2C exhibited the problem of a large number of scratches.

Example 5C

An aqueous dispersion for CMP adjusted to pH 4 with KOH was prepared by dissolving 2 wt % of silicomolybdic acid (product of Wako Junyaku Co., Ltd.) and 2 wt % of maleic acid (product of Wako Junyaku Co., Ltd.) in water and further dispersing 2 wt % of colloidal silica with a primary particle size of 15 nm was dispersed.

A blanket wafer ("Cu-Blanket", product of IMAT Corp.) with a copper layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 12 Å/min. Also, an 8-inch thermal oxidation film-coated silicon wafer coating copper film (product name: "Cu-Blanket", film thickness: 10,000 Å, product of IMAT Corp.) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm². The urethane pad surface was subjected to one minute of rotary polishing with the table at 50 rpm and the head at 50 rpm while supplying the aqueous dispersion at a rate of 200 cc/min. As a result, the removal rate as measured with an Omnimap RS-75 (product of KLA-Tencor Corp.) was 5400 Å/min. The WIWNU was measured by the same method as Example 1A, resulted in that 3 σ was 17.5%. Also, calculation of the number of scratches (Kt) produced on the entire polishing surface with a wafer surface matter scanning apparatus ("Surfacescan SP1", product of KLA Tencor Co., Ltd.), yielded a result of one scratch per unit area.

A wiring-patterned wafer (SKW6-2, product of SKW Corp.) was also 30% over-polished, and the dishing of a 100 μm wiring width was evaluated to be a satisfactory 650 Å.

Examples 6C–8C, Comparative Examples 3C, 4C

The colloidal silica, heteropolyacid or other oxidizing agent, as well as the type and amount of organic acid and the pH, were changed as shown in Table 7, and the etching rates and polishing performance on copper films were evaluated in the same manner as Example 5C. The results are shown in Table 7.

The silicotungstic acid used was a product of Wako Junyaku Co., Ltd. The phosphoromolybdic acid and fumed alumina were obtained in the same manner as those in Table 6.

The pH was also adjusted by addition of KOH where necessary.

TABLE 7

| | abrasive types (primary particle size) (content) | heteropolyacid types (content) | other oxidizing agent (content) | organic acid types (content) |
|---|---|---|---|---|
| Examples | | | | |
| 5C | colloidal silica(15 nm) (2 wt %) | silicomolybdic acid (2 wt %) | — | maleic acid (2 wt %) |
| 6C | colloidal silica(15 nm) (1 wt %) | silicotungstic acid (3 wt %) | — | — |
| 7C | colloidal silica(35 nm) (3 wt %) | phosphoromolybdic acid (1 wt %) | — | malonic acid (3 wt %) |
| 8C | colloidal silica(75 nm) (2.5 wt %) | silicomolybdic acid (0.5 wt %) | — | — |
| Comparative Examples | | | | |
| 3C | colloidal silica(15 nm) (2 wt %) | — | hydrogen peroxide (2 wt %) | maleic acid (2 wt %) |
| 4C | fumed alumina(13 nm) (1 wt %) | silicotungstic acid (3 wt %) | — | — |

| | pH | etching rate (Å/min) | removal rate (Å/min) | dishing (Å) | uniformity WIWNU 3 σ(%) | number of scraches |
|---|---|---|---|---|---|---|
| Examples | | | | | | |
| 5C | 4 | 12 | 5400 | 650 | 17.5 | 1 |
| 6C | 5 | 19 | 4900 | 800 | 18.7 | 3 |
| 7C | 4.5 | 25 | 6300 | 550 | 15.2 | 0 |
| 8C | 4 | 11 | 4200 | 1010 | 30.3 | 11 |

TABLE 7-continued

| Comparative Examples | | | | | | |
|---|---|---|---|---|---|---|
| 3C | 4 | 150 | 3200 | 1880 | 77.8 | 2 |
| 4C | 5 | 21 | 4800 | 1090 | 23.0 | 87 |

According to the results in Table 7, the etching rates were 25 Å/min or less in Examples 6C to 8C. The removal rates were 4200 Å/min or greater, which were sufficient rates of polishing. Also, very few scratches were found, and thus no problem was posed. On the other hand, Comparative Example 3C exhibited the problem of a high etching rate and considerable dishing, while Comparative Example 4C exhibited the problem of a large number of scratches.

Example 9C

An aqueous dispersion for CMP adjusted to pH 4 with KOH was prepared by dissolving 5 wt % of silicomolybdic acid (product of Wako Junyaku Co., Ltd.) and 2 wt % of malonic acid (product of Wako Junyaku Co., Ltd.) in water and further dispersing 3 wt % of colloidal silica with a primary particle size of 15 nm.

A blanket wafer with an aluminum layer was immersed in the aqueous dispersion at 25° C. for 30 minutes, and the film thickness loss after 30 minutes was determined by measuring the sheet resistance with a resistance measuring instrument (Model Sigma 5, product of NSP Corp.) according to the 4-probe method; the etching rate was calculated and found to be 15 Å/min. Also, an 8-inch thermal oxidation film-coated silicon wafer coating aluminum film (film thickness: 6,000 Å) was set in a chemical mechanical polishing apparatus (Model "EPO-112", product of Ebara Corp.), and a porous polyurethane polishing pad (product name: "IC1000" by Rodel Nitta Corp.) was used for polishing with a load at 300 g/cm². The urethane pad surface was subjected to one minute of rotary polishing with the table at 100 rpm and the head at 100 rpm while supplying the aqueous dispersion at a rate of 200 cc/min. As a result, the removal rate as measured with an Omnimap RS-75 (product of KLA-Tencor Corp.) was 3200 Å/min. The WIWNU was measured by the same method as Example 1A, resulted in that 3 σ was 19.2%. Also, calculation of the number of scratches (Kt) produced on the entire polishing surface with a wafer surface matter scanning apparatus ("Surfacescan SP1", product of KLA Tencor Co., Ltd.), yielded a result of 3 scratches per unit area. A wiring-patterned wafer was also 30% over-polished, and the dishing of a 100 μm wiring width was evaluated to be a satisfactory 950 Å.

Examples 11C–11C, Comparative Example 5C

The colloidal silica, heteropolyacid or other organic acid, as well as the type and amount of organic acid and the pH, were changed as shown in Table 8, and the etching rates and polishing performance on aluminum films were evaluated in the same manner as Example 9C. The results are shown in Table 8.

The pH was also adjusted by addition of KOH where necessary.

According to the results in Table 8, the etching rates were 25 Å/min or less in Examples 9C to 11C. The removal rates were 2500 Å/min or greater, which were sufficient rates of polishing. Also, very few scratches were found, and thus no problem was posed. On the other hand, Comparative Example 5C exhibited the problems of a high etching rate, considerable dishing and a large number of scratches.

TABLE 8

| | abrasive types (primary particle size) (content) | heteropolyacid types (content) | other oxidizing agent (content) | organic acid types (content) |
|---|---|---|---|---|
| Example | | | | |
| 9C | colloidal silica(15 nm) (3 wt %) | silicomolybdic acid (5 wt %) | — | malonic acid (2 wt %) |
| 10C | colloidal silica(35 nm) (5 wt %) | silicotungstic acid (2 wt %) | — | oxalic acid (3 wt %) |
| 11C | colloidal silica(75 nm) (1 wt %) | silicomolybdic acid (1 wt %) | — | maleic acid (1 wt %) |
| Comparative Examples | | | | |
| 5C | colloidal silica(15 nm) (3 wt %) | — | hydrogen peroxide (5 wt %) | malonic acid (2 wt %) |

| | pH | etching rate (Å/min) | removal rate (Å/min) | dishing (Å) | uniformity WIWNU 3 σ(%) | number of scraches |
|---|---|---|---|---|---|---|
| Example | | | | | | |
| 9C | 4 | 15 | 3200 | 950 | 19.2 | 3 |
| 10C | 3.5 | 25 | 2500 | 800 | 25.3 | 2 |
| 11C | 3.7 | 19 | 2900 | 1010 | 22.1 | 9 |

TABLE 8-continued

| Comparative Examples | | | | | | |
|---|---|---|---|---|---|---|
| 5C | 4 | 140 | 1500 | 1650 | 21.8 | 63 |

What is claimed is:

1. An aqueous dispersion for chemical mechanical polishing comprising an abrasive, water and a heteropolyacid.

2. An aqueous dispersion for chemical mechanical polishing according to claim 1, wherein said heteropolyacid is at least one selected from the group consisting of silicomolybdic acid, phosphorotungstic acid, silicotungstic acid, phosphoromolybdic acid and silicotungstomolybdic acid.

3. A method comprising polishing a tungsten film with the aqueous dispersion according to claim 1.

4. A method comprising polishing at least one selected from the group consisting of copper films, aluminum films, ruthenium films, tantalum films, titanium films and platinum films with the aqueous dispersion according to claim 1.

5. A method comprising polishing a metal layer with the aqueous dispersion according to claim 1, wherein upon contact with the metal layer, said metal layer is etched at a rate of 100 Å/min or less.

6. An aqueous dispersion for chemical mechanical polishing, comprising an abrasive, water, a heteropolyacid and an organic acid.

7. An aqueous dispersion for chemical mechanical polishing according to claim 6, wherein said heteropolyacid is at least one selected from the group consisting of silicomolybdic acid, phosphorotungstic acid, silicotungstic acid, phosphoromolybdic acid and silicotungstomolybdic acid.

8. An aqueous dispersion for chemical mechanical polishing according to claim 6, wherein said organic acid is at least one selected from the group consisting of oxalic acid, malonic acid, succinic acid, maleic acid, fumaric acid, phthalic acid, malic acid, tartaric acid and citric acid.

9. A method comprising polishing a pure tungsten film or an alloy film of tungsten and another metal, with the aqueous dispersion according to claim 6.

10. A method comprising polishing at least one selected from the group consisting of pure copper films, pure aluminum films, and alloy films of aluminum or copper, and another metal, with the aqueous dispersion according to claim 6.

11. An aqueous dispersion for chemical mechanical polishing, comprising colloidal silica with a primary particle size of 5–100 nm, water and a heteropolyacid.

12. An aqueous dispersion for chemical mechanical polishing according to claim 11, wherein said colloidal silica is colloidal silica obtained by hydrolysis and condensation from an alkoxysilane.

13. An aqueous dispersion for chemical mechanical polishing according to claim 11, wherein heteropolyacid is at least one selected from the group consisting of silicomolybdic acid, phosphorotungstic acid, silicotungstic acid, phosphoromolybdic acid and silicotungstomolybdic acid.

14. An aqueous dispersion for chemical mechanical polishing according to claim 11, further comprising an organic acid.

15. A method comprising polishing a tungsten film with the aqueous dispersion according to claim 11.

16. A method comprising polishing at least one selected from among copper films, aluminum films, ruthenium films, tantalum films, titanium films and platinum films with the aqueous dispersion according to claim 11.

* * * * *